United States Patent [19]
Carralero et al.

[11] Patent Number: 6,002,303
[45] Date of Patent: Dec. 14, 1999

[54] OSCILLATOR CIRCUIT HAVING A DIFFERENTIAL CONFIGURATION AND METHOD OF FORMING SAME

[75] Inventors: Cesar Carralero, Hialeah; Raul Salvi, Boca Raton; Branko Avanic, Miami, all of Fla.

[73] Assignee: Motorola, Inc., Schaumburg, Ill.

[21] Appl. No.: 09/027,270

[22] Filed: Feb. 20, 1998

[51] Int. Cl.[6] ............................... H03L 7/00; H03B 5/00
[52] U.S. Cl. ................... 331/117 R; 331/177 V; 331/108 D; 331/175; 455/260; 455/262
[58] Field of Search ........................ 331/117 R, 167, 331/116 FE, 111, 177 V, 175, 108 D; 455/256, 259, 264, 195.1, 180.3, 260, 262; 330/283, 292

[56] References Cited

U.S. PATENT DOCUMENTS

| | | | |
|---|---|---|---|
| 3,643,168 | 2/1972 | Manicki . | |
| 4,492,934 | 1/1985 | Sugimoto | 331/117 R |
| 5,012,205 | 4/1991 | Howell | 331/117 R |
| 5,187,450 | 2/1993 | Wagner et al. | 331/96 |
| 5,434,545 | 7/1995 | Burchfield | 331/143 |
| 5,486,796 | 1/1996 | Ishikawa et al. | 331/117 R |

*Primary Examiner*—Arnold Kinkead
*Attorney, Agent, or Firm*—Barbara R. Doutre

[57] ABSTRACT

An oscillator circuit (100) provides improved noise immunity by utilizing a differential common base configuration. The oscillator includes a differential transistor pair (102, 104) having common bases (110) coupled through an AC ground (108) and emitters coupled through a differential common mode point (120). First and second resonant tank circuits are each referenced to the differential common mode point (120) for generating a differential output (OUT, OUTX).

36 Claims, 4 Drawing Sheets

OSCILLATOR CIRCUIT HAVING A DIFFERENTIAL CONFIGURATION AND METHOD OF FORMING SAME

TECHNICAL FIELD

This invention relates to electronic oscillators.

BACKGROUND

Oscillators are used in a variety of electronic circuits. The simplest and most traditional of oscillators uses an inductor (L) and a capacitor (C) in an LC tank circuit with an amplifier to overcome inescapable circuit losses that would otherwise dampen any oscillations in the LC tank. The frequency of oscillation depends on the circuit inductance (inductor L plus stray inductances Ls) and the circuit capacitance (capacitor C plus stray capacitances Cs). The general formula relating frequency to inductance is:

$$f = \frac{1}{2\pi\sqrt{LC}}$$

More accurate frequencies are generated by crystal oscillators where the piezoelectric effect of a cut crystal is used to source a weak frequency signal that is built up by an amplifier. Crystal oscillators have the advantage of very accurate and stable frequency operation, but are difficult to tune to other frequencies because the crystal cannot be reactively pulled off its natural frequency by more than a few fractions of a percent.

Frequency synthesis with phase locked loops (PLLs) involves a type of oscillator that has crystal oscillator accuracy and stability, and yet can be tuned to a wide range of frequencies. Most modern day radios, television, and communications equipment use frequency synthesis. A fixed crystal oscillator is used in a synthesizer to generate a reference frequency. A phase detector compares the reference frequency to the output of a voltage controlled oscillator (VCO) after being divided down by a counter. The output of the phase detector is amplified and integrated for use as a control to the VCO. The output of the VCO will lock onto a harmonic "N" of the reference frequency, where "N" is the count value of the divider Regardless of the circuit application, the design of oscillator circuits has always involved weighing various tradeoffs. High parts count and cost, resonator size, current drain, noise performance, required bandwidth, and external interference sensitivity are just a few of the issues to be considered when designing an oscillator circuit. For example, mobile/portable radio communication units are limited in the size and weight of devices they can incorporate. One approach to this size constraint is the complete integration of a VCO. While integration alleviates the size and cost issues, the external interference sensitivity and noise levels can still be a problem even in an integrated environment.

Accordingly, there is a need for an improved oscillator design which provides reduced noise interference sensitivity. An oscillator design which would also lend itself to single chip integration and be less susceptible to process variations would be beneficial to radio circuit designs, particularly those utilizing VCOs.

DETAILED DESCRIPTION OF THE PREFERRED EMBODIMENT

Figure 1:
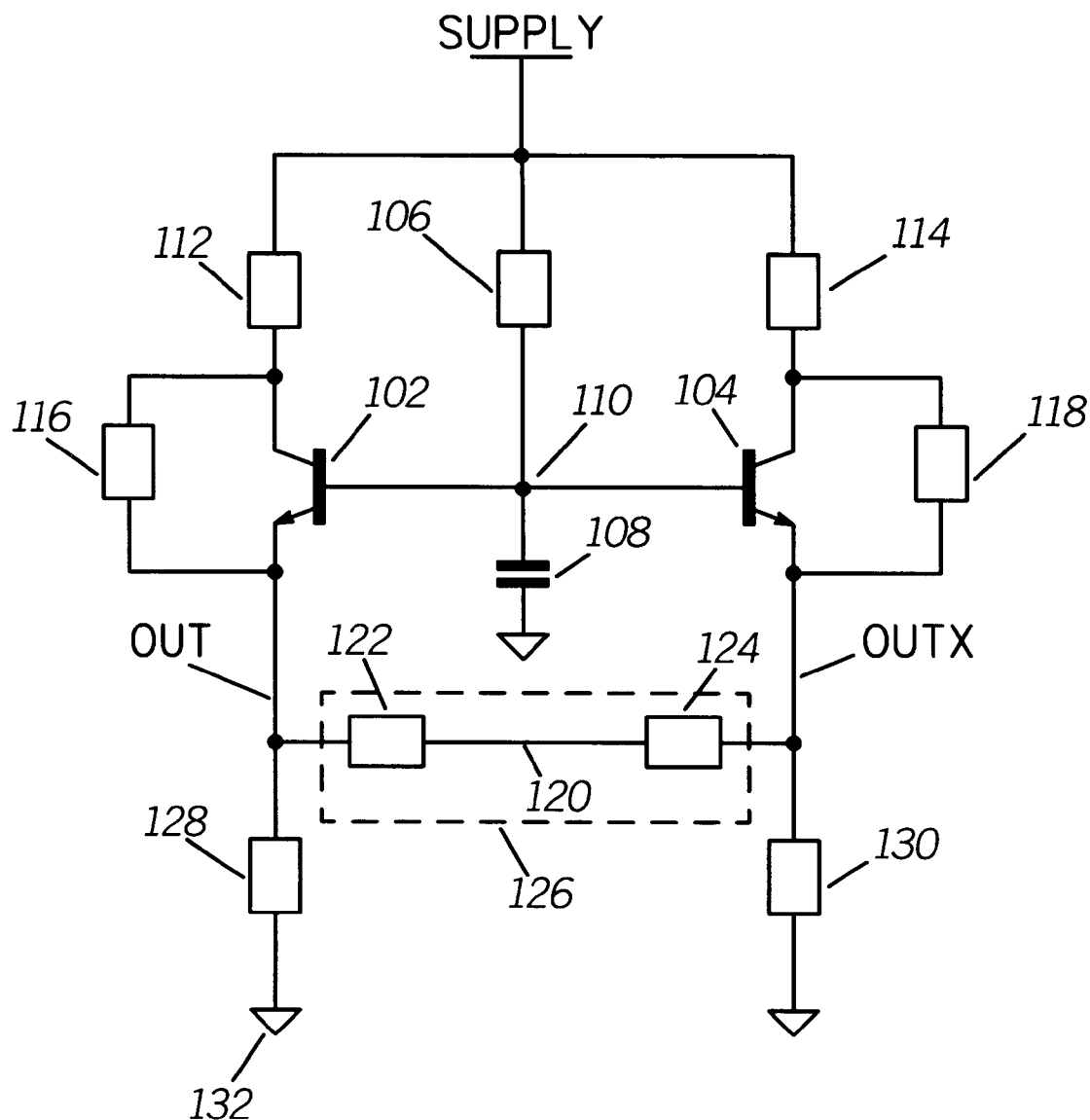
FIG. 1 is a block diagram of an oscillator in accordance with the present invention.

While the specification concludes with claims defining the features of the invention that are regarded as novel, it is believed that the invention will be better understood from a consideration of the following description in conjunction with the drawing figures, in which like reference numerals are carried forward.

In accordance with the present invention, a differential common base oscillator design, to be described herein, provides improved immunity to noise interference. Referring now to FIG. 1, there is shown an oscillator circuit 100 in accordance with the present invention. Oscillator 100 comprises first and second transistors 102, 104 each having a base, emitter, and collector. The first and second transistors 102, 104 are coupled in a common base configuration for receiving a DC bias 106. In accordance with the present invention, an AC ground 108 is coupled to the common bases 110. First and second resonant elements 112, 114 are coupled to supply and to each of the first and second transistors 102, 104 respectively. Elements 112, 114 preferably comprise inductive components.

The oscillator 100 of the present invention further comprises first and second feedback paths 116, 118 operatively coupled to provide positive feedback across the collector and emitter of each of the first and second transistors 102, 104. The feedback mechanisms 116, 118 can be capacitive, inductive, or magnetic. Elements 112, 114 can comprise resistive components when used in conjunction with inductive components in the feedback paths 116, 118.

In accordance with the present invention, the emitters of transistors 102, 104 are coupled in a differential common mode configuration to generate a differential signal across the emitters. The differential common mode configuration is formed by coupling a virtual ground 120 between the emitters of the first and second transistors 102, 104. The differential configuration is achieved by coupling either capacitive, inductive, or resistive elements between the emitters of transistors 102, 104 thus forming a differential transistor pair. For the purposes of showing that a virtual ground point 120 exists between the two emitters, the differential coupling is shown as being achieved using two series elements 122, 124 In practice, however, a single element, conveyed by designator 126, would be sufficient. Bias elements 128, 130 are provided to the transistors 102, 104 through suitable sources, such as current sinks, to ground potential 132.

In accordance with the present invention, the first resonant element 112, first feedback path 116, differential coupling element 122, and virtual ground 120 form a first tank circuit and the second resonant element 114, second feedback path 118, differential coupling element 124, and virtual ground 120 form a second tank circuit. Output signals, OUT, OUTX, are generated at the emitters of transistors 102, 104 as well as at the collectors. Because of the differential design of oscillator 100, output signals, OUT, OUTX, are approximately 180 degrees out of phase with each other and effectively cancel each other out at the virtual ground point 120. If a probe were placed between the elements 122, 124, the cancellation of the two output signal would be observed. For the purposes of this specification, virtual ground is therefore defined as a point which provides for the cancellation of two AC signals. Again, while shown as two series elements, the virtual ground effect is just as easily achieved through the use of a component 126 coupled between the emitters.

The advantage of the oscillator design 100 described by the invention is that noise coming through the supply 106 or ground potential 132 or radiated noise has little effect on the circuit performance. Because the oscillator outputs, OUT, OUTX, are not being referenced to ground potential 132 but rather are referenced to the virtual ground point 120, common mode noise will not affect the differential mode gain of the design.

The oscillator circuit 100 of the present invention can be implemented using a variety of components including tunable elements, such as voltage variable capacitors, varactors, and capacitive switches, such that the oscillator operates as a voltage controlled oscillator (VCO). Oscillator 100 may be integrated as part of a semiconductor substrate or formed of discrete components. While shown in a configuration of npn transistors, the oscillator may similarly be implemented using pnp transistors.

The following table includes, but is not limited to, various combinations of elements with which oscillator 200 can be formed. L represents inductance, C represents capacitance, R represents resistance, and M represents magnetic coupling. component

| component | | | | | |
|---|---|---|---|---|---|
| 112, 114 | L | L | R | R | L |
| 116, 118 | C | M | L | C | C |
| 126 | C | L | C | L | R |

As seen by the table, several configurations are possible The essence of the oscillator configuration 100 described by the invention is that it is structured as a common base differential structure. Since the structure is differential it does not react to common mode type interference sources. While differential common collector oscillator designs do exist, the advantage of the common base design described by the invention, is the removal of base charge capacitance from the oscillator circuit. The base charge capacitance is essentially grounded through the AC ground 108 in the oscillator described by the invention.

Figure 2:
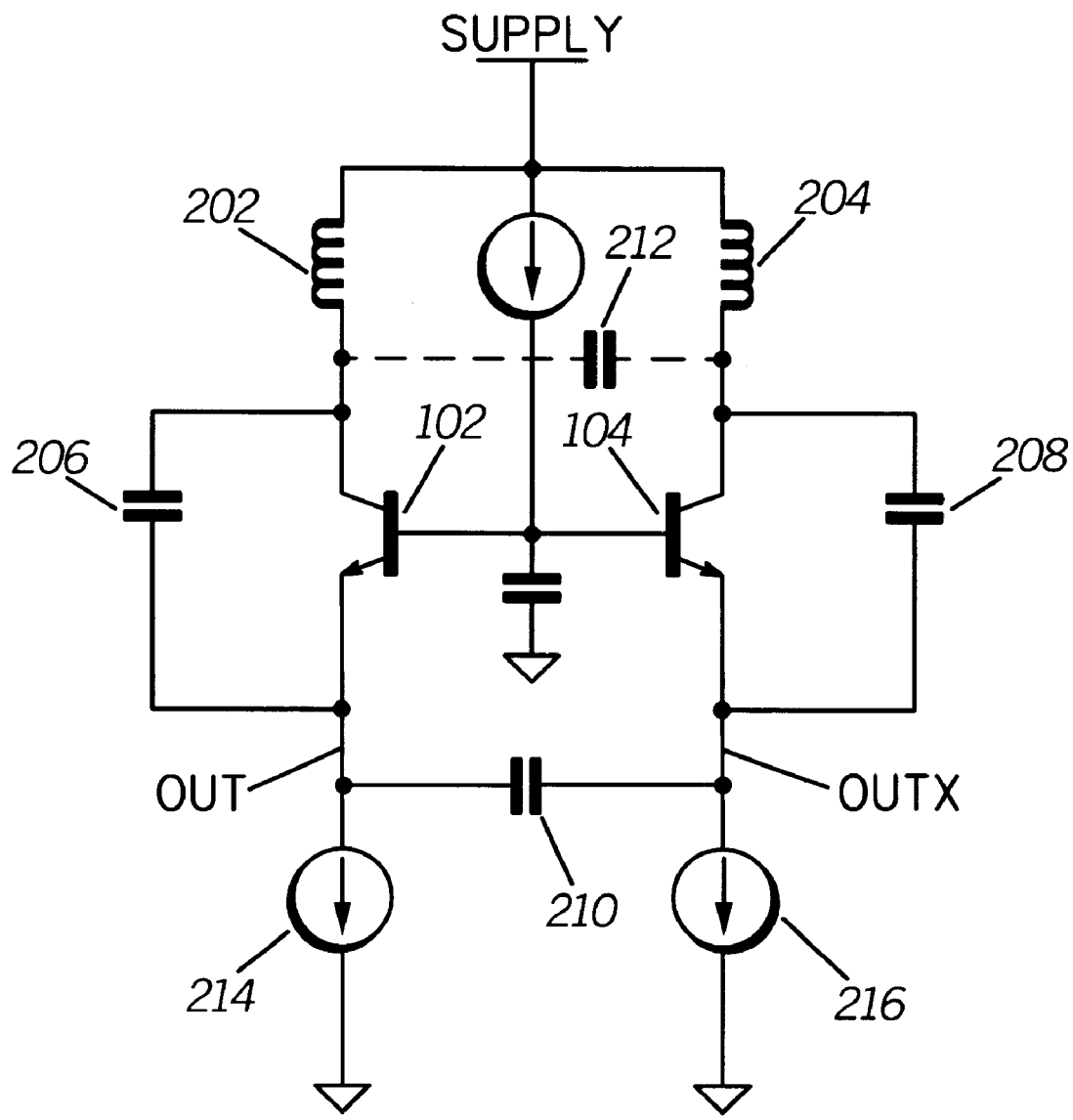
FIG. 2 is circuit diagram of a preferred embodiment of the oscillator of FIG. 1.

Referring now to FIG. 2, there is shown a preferred embodiment of an oscillator 200 in accordance with the present invention. The preferred embodiment uses a combination of inductive resonant elements 202, 204 capacitive feedback paths 206, 208 and a capacitive differential coupling element 210 coupled between the emitters of transistors 102, 104. Bias elements have been provided through current sources 214, 216. In an integrated environment, capacitive feedback paths are preferred because they take up minimal space.

In accordance with the present invention, differential coupling element 210, shown here as a capacitor, is coupled between the emitters of transistors 102, 104 creating a virtual ground for the first and second tank circuits. The first tank circuit is formed through inductor 202, capacitive feedback path 206, and differential coupling element 210. The second tank circuit is formed through inductor 204, capacitive feedback path 208, differential coupling element 210. A relatively high quality factor, Q, can be achieved for the tank circuits by utilizing capacitive switches on the collectors of transistors 102, 104 and VVC tuning between the emitters. Additional tuning control can be achieved, if desired, by the addition of capacitive coupling 212 between the collectors of the differential pair.

The formation of the preferred oscillator embodiment 200 may also be described in terms of a series of method steps. In accordance with the present invention, a differential signal which is substantially impervious to common mode noise is generated by coupling the bases of two transistors together, AC coupling the coupled bases to ground, and forming a differential common mode point between the emitters of the transistors. By providing a resonant element between each collector and supply, and providing first and second feedback paths across the collector/emitter junction of each transistor, a differential signal across the emitters will be generated when the DC bias is supplied to the common bases.

In accordance with the present invention, the step of forming a differential common mode point between the emitters of the first and second transistors comprises the step of capacitively, inductively, or resistively coupling the emitters together thereby forming a virtual ground for the first and second tank circuits. The first tank circuit is formed through the first resonant element, first feedback path, and differential coupling element to virtual ground. The second tank circuit is formed through the second resonant element, second feedback path, and differential coupling element to virtual ground.

Figure 3:
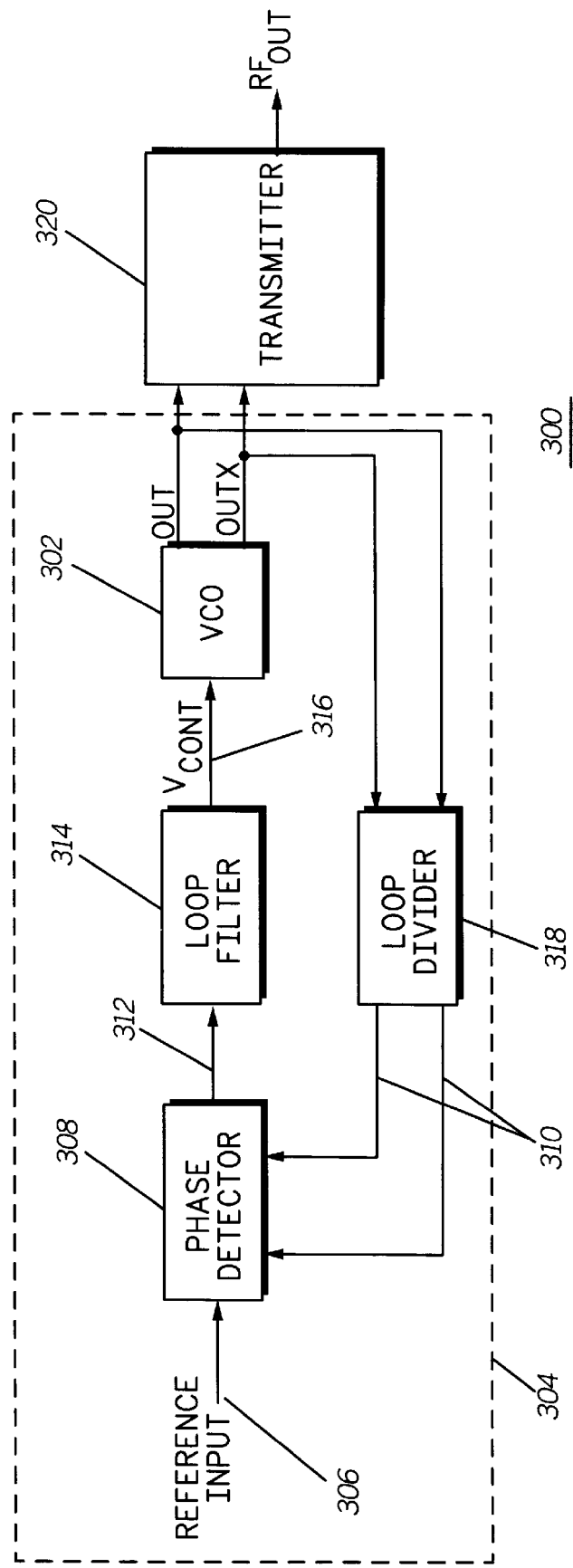
FIG. 3 is a partial radio block diagram incorporating the oscillator of the present invention into a phase lock loop circuit for a transmitter.

Referring now to FIG. 3, there is shown a partial radio block diagram 300 in which the oscillator described by the invention is implemented as a VCO 302 as part of a phase lock loop circuit (PLL) 304. The PLL 304 is preferably formed as a single chip integrated circuit, and VCO 302 is characterized by the differential common base configuration in accordance with the present invention. The PLL 304 receives reference input signal 306 which is typically derived from a crystal controlled oscillator (not shown). A phase detector 308 compares the phase difference between the reference input 306 and a divided differential VCO frequency 310 in order to produce an error voltage 312. The error voltage 312 is filtered at a loop filter 314 to produce a DC signal, referred to as a control voltage signal (Vcont) 316. The control voltage signal 316 is fed to the VCO 302 to steer the frequency of the VCO. The control signal (Vcont) is used to tune the elements of the VCO's first and second tank circuits. The differential output of the VCO (OUT, OUTX) is divided by integer N through loop divider 318 for phase locking. The differential output (OUT, OUTX) is also sent to a transmitter 320 for further amplification and processing to generate the radio output carrier frequency, RF OUT.

Figure 4:
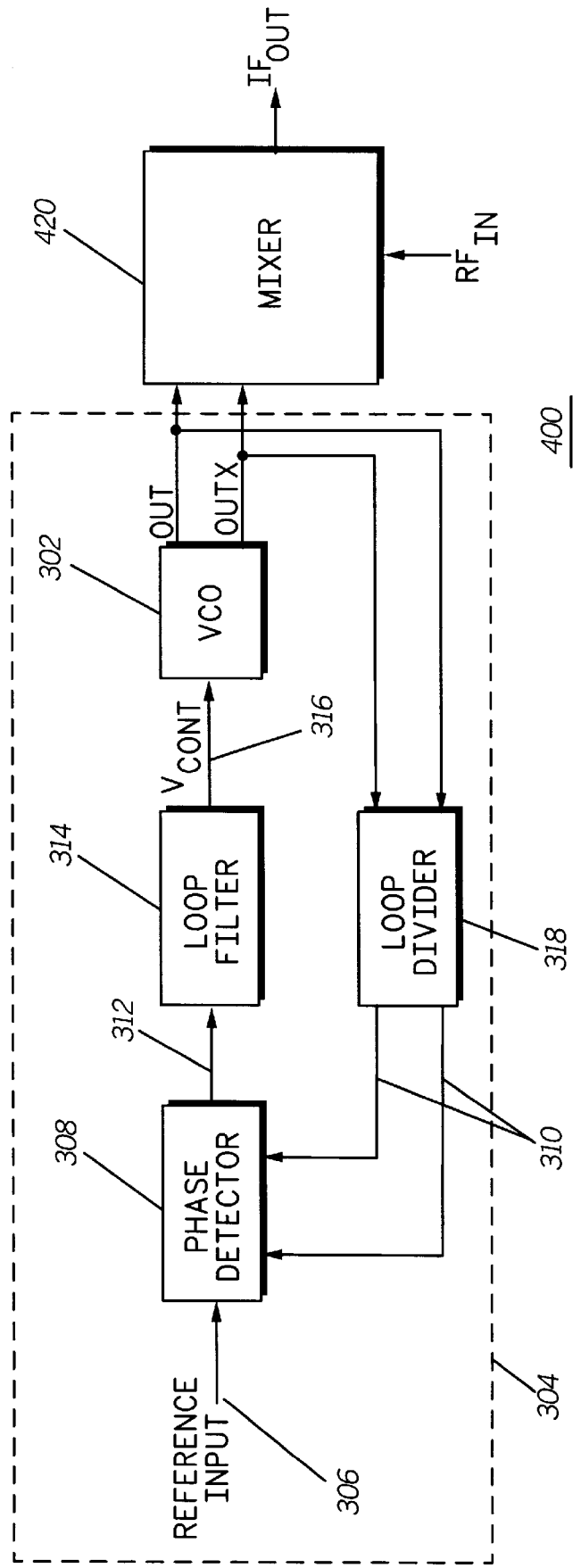
FIG. 4 is a partial radio block diagram incorporating the oscillator of the present invention into a phase lock loop circuit for a receiver.

FIG. 4 shows another radio embodiment in which the PLL 304 utilizing the VCO 302 is implemented as part of a receiver circuit 400. In receiver 400, a received RF signal, $RF_{IN}$, is mixed down, through a mixer 420, with the differential signal, OUT, OUTX, to produce an intermediate frequency output, $IF_{OUT}$. Thus, the oscillator described by the invention lends itself well to both transmitter and receiver applications.

Integrated circuit techniques have been used in countless applications to put all or nearly all circuit components on a single chip. Inherent IC processing variations can produce deviations in inductance, resistance, capacitance, or other important characteristics. In the past, these process variations could dramatically affect the frequency accuracy and operational noise levels of a VCO that was incorporated into an IC. However, the differential common base characteristic of the VCO 302 formed in accordance with the present invention makes the VCO less sensitive to process variations. Low noise VCOs subject to precision high frequency requirements, have traditionally required very tight IC processing control. Now however, by using the differential common base design approach described by the invention, the tight processing requirements can be somewhat relaxed thus making the manufacturing of these VCOs less expensive to produce.

Accordingly, there has been provided an oscillator design which, through the use of a differential common base configuration, provides reduced sensitivity to noise interference. The oscillator described by the invention lends itself well to single chip applications with less sensitivity to process variations making it particularly desirable for such circuits as VCOs.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An oscillator, comprising:
    first and second transistors each having a base, emitter, and collector, the first and second transistors being coupled in a common base configuration and DC biased through the common bases;
    an AC ground coupled to the common bases;
    first and second feedback paths operatively coupled across the emitter and collector of each of the first and second transistors respectively;
    first and second resonant elements coupled to the first and second feedback paths respectively and the first and second resonant elements receiving a DC supply voltage; and
    the emitters of the first and second transistors being coupled through a differential coupling element to virtual ground such that a first tank circuit is formed via the first resonant element, the first feedback path, and the differential coupling element to virtual ground, and a second tank circuit is formed via the second resonant element, the second feedback path, and the differential coupling element to virtual ground.

2. An oscillator as described in claim 1, wherein the first and second resonant elements comprise first and second inductors respectively.

3. An oscillator as described in claim 1, wherein the first and second feedback paths are formed of first and second capacitors coupled across the collector and emitter of each of the first and second transistors respectively.

4. An oscillator as described in claim 1, wherein the first and second feedback paths are formed of first and second inductors coupled across the collector and emitter of each of the first and second transistors respectively.

5. An oscillator as described in claim 1, wherein the first and second feedback paths are formed by providing magnetic coupling across the collector and emitter of each of the first and second transistors.

6. An oscillator as described in claim 1, wherein the differential coupling element comprises a capacitor coupled across the emitters of the first and second transistors.

7. An oscillator as described in claim 1, wherein the differential coupling element comprises a resistor coupled across the emitters of the first and second transistors.

8. An oscillator as described in claim 1, wherein the differential coupling element comprises an inductor coupled across the emitters of the first and second transistors.

9. An oscillator as described in claim 1, wherein the oscillator is a voltage controlled oscillator (VCO) having capacitive tuning elements as the first and second feedback paths and wherein the differential coupling element comprises a capacitive tuning element coupled across the emitters of the first and second transistors.

10. An oscillator as described in claim 1, wherein the oscillator is integrated.

11. An oscillator as described in claim 1, wherein the oscillator is formed of discrete components.

12. An oscillator as described in claim 1, wherein the transistors comprise npn transistors.

13. An oscillator as described in claim 1, wherein the transistors comprise pnp transistors.

14. An oscillator as described in claim 1, wherein the collectors of the first and second transistors are capacitively coupled together.

15. A method of generating a differential signal in an oscillator having first and second transistors, each transistor having a base, collector, and emitter, comprising the steps of:
    coupling the bases of the first and second transistors together;
    AC coupling the coupled bases to ground;
    supplying a DC bias to the coupled bases;
    providing first and second resonant elements to the collectors of the first and second transistors;
    supplying the DC bias to the first and second resonant elements;
    providing first and second feedback paths across the collector and emitter of each of the first and second transistors by inductively coupling the collector and emitter of each of the first and second transistors respectively;
    forming a differential common mode point between the emitters of the first and second transistors; and
    generating a differential signal across the emitters of the first and second transistors.

16. The method of claim 15, wherein the step of forming a differential common mode point provides a first tank circuit through the first resonant element, first feedback path, and differential common mode point, and provides a second tank circuit through the second resonant element, second feedback path, and differential common mode point.

17. The method of claims 15, wherein the oscillator is integrated.

18. The method of claims 15, wherein the oscillator is formed of discrete components.

19. A method of generating a differential signal in an oscillator having first and second transistors, each transistor having a base, collector, and emitter, comprising the steps of:
    coupling the bases of the first and second transistors together;
    AC coupling the coupled bases to ground;
    supplying a DC bias to the coupled bases;
    providing first and second resonant elements to the collectors of the first and second transistors;
    supplying the DC bias to the first and second resonant elements;

providing first and second feedback paths across the collector and emitter of each of the first and second transistors by magnetically coupling the collector and emitter of each of the first and second transistors respectively;

forming a differential common mode point between the emitters of the first and second transistors; and generating a differential signal across the emitters of the first and second transistors.

20. A method of generating a differential signal in an oscillator having first and second transistors, each transistor having a base, collector, and emitter, comprising the steps of:

coupling the bases of the first and second transistors together;

AC coupling the coupled bases to ground;

supplying a DC bias to the coupled bases;

providing first and second resonant elements to the collectors of the first and second transistors;

supplying the DC bias to the first and second resonant elements;

providing first and second feedback paths across the collector and emitter of each of the first and second transistors;

forming a differential common mode point between the emitters of the first and second transistors by capacitively coupling the emitters of the first and second transistors; and generating a differential signal across the emitters of the first and second transistors.

21. The method of claim 15, wherein the step of forming a differential common mode point comprises the step of resistively coupling the emitters of the first and second transistors.

22. A method of generating a differential signal in an oscillator having first and second transistors, each transistor having a base, collector, and emitter, comprising the steps of:

coupling the bases of the first and second transistors together;

AC coupling the coupled bases to ground;

supplying a DC bias to the coupled bases;

providing first and second resonant elements to the collectors of the first and second transistors;

supplying the DC bias to the first and second resonant elements;

providing first and second feedback paths across the collector and emitter of each of the first and second transistors;

forming a differential common mode point between the emitters of the first and second transistors by inductively coupling the emitters of the first and second transistors; and generating a differential signal across the emitters of the first and second transistors.

23. A radio, including:

a voltage controlled oscillator (VCO), comprising:

first and second transistors each having a base, emitter, and collector, the first and second transistors being coupled in a common base configuration for receiving a DC input bias through the common bases;

an AC ground coupled to the common bases;

first and second resonant elements coupled to the collector of each of the first and second transistors respectively;

first and second feedback paths formed of voltage variable capacitors operatively coupled across the collector and emitter of each of the first and second transistors respectively, the emitters further being coupled in a differential common mode configuration to generate a differential signal; and a transmitter for receiving the differential signal and generating a radio frequency (RF) carrier output.

24. The radio of claim 23, wherein the VCO is incorporated as part of a phase lock loop (PLL) circuit.

25. A radio, including:

a voltage controlled oscillator (VCO), comprising:

first and second transistors each having a base, emitter, and collector, the first and second transistors being coupled in a common base configuration for receiving a DC input bias through the common bases;

an AC ground coupled to the common bases;

first and second resonant elements coupled to the collector of each of the first and second transistors respectively;

first and second feedback paths operatively coupled across the collector and emitter of each of the first and second transistors respectively, the emitters further being coupled in a differential common mode configuration formed by a varactor coupled between the emitters of the first and second transistors to generate a differential signal; and a transmitter for receiving the differential signal and generating a radio frequency (RF) carrier output.

26. A radio, including:

a voltage controlled oscillator (VCO), comprising:

first and second transistors each having a base, emitter, and collector, the first and second transistors being coupled in a common base configuration for receiving a DC input bias through the common bases;

an AC ground coupled to the common bases;

first and second resonant elements coupled to the collector of each of the first and second transistors respectively;

first and second feedback paths formed by first and second varactors operatively coupled across the collector and emitter of each of the first and second transistors respectively, the emitters further being coupled in a differential common mode configuration to generate a differential signal; and a mixer for mixing down a received radio frequency (RF) signal with the differential signal to generate an intermediate frequency (IF) signal.

27. The radio of claim 26, wherein the VCO is incorporated as part of a phase lock loop (PLL) circuit.

28. A voltage controlled oscillator (VCO), comprising:

first and second transistors each having a base, emitter, and collector, the first and second transistors being coupled in a common base configuration for receiving a DC input bias through the common bases;

an AC ground coupled to the common bases;

first and second resonant elements coupled to the collector of each of the first and second transistors respectively;

first and second feedback paths operatively coupled across the collector and emitter of each of the first and second transistors respectively, the emitters further being coupled in a differential common mode configuration formed by a voltage variable capacitor coupled between the emitters of the first and second transistors to generate a differential signal; and a mixer for mixing down a received radio frequency (RF) signal with the differential signal to generate an intermediate frequency (IF) signal.

29. The radio of claim 27, wherein the PLL is integrated as part of a single chip IC.

30. The radio of claim 26, wherein the differential common mode configuration is formed by a voltage variable capacitor coupled between the emitters of the first and second transistors.

31. The radio of claim 28, wherein the first and second feedback paths comprise first and second varactors.

32. An oscillator, comprising:
first and second transistors each having a base, emitter, and collector, the first and second transistors being coupled in a common base configuration and DC biased through the common bases;
an AC ground coupled to the common bases;
first and second feedback paths, formed of first and second inductors, operatively coupled across the emitter and collector of each of the first and second transistors respectively;
first and second resonant elements coupled to the first and second feedback paths respectively and the first and second resonant elements receiving a DC supply voltage; and
the emitters of the first and second transistors being coupled through a differential coupling element to virtual ground such that a first tank circuit is formed via the first resonant element, the first feedback path, and the differential coupling element to virtual ground, and a second tank circuit is formed via the second resonant element, the second feedback path, and the differential coupling element to virtual ground.

33. An oscillator, comprising:
first and second transistors each having a base, emitter, and collector, the first and second transistors being coupled in a common base configuration and DC biased through the common bases;
an AC ground coupled to the common bases;
first and second feedback paths, formed of a magnetic coupling, operatively coupled across the emitter and collector of each of the first and second transistors respectively;
first and second resonant elements coupled to the first and second feedback paths respectively and the first and second resonant elements receiving a DC supply voltage; and
the emitters of the first and second transistors being coupled through a differential coupling element to virtual ground such that a first tank circuit is formed via the first resonant element, the first feedback path, and the differential coupling element to virtual ground, and a second tank circuit is formed via the second resonant element, the second feedback path, and the differential coupling element to virtual ground.

34. A method of generating a differential signal in an oscillator having first and second transistors, each transistor having a base, collector, and emitter, comprising the steps of:
coupling the bases of the first and second transistors together;
AC coupling the coupled bases to ground;
supplying a DC bias to the coupled bases;
providing first and second resonant elements to the collectors of the first and second transistors;
supplying the DC bias to the first and second resonant elements;
providing first and second feedback paths across the collector and emitter of each of the first and second transistors by inductively coupling the collector and emitter of each of the first and second transistors respectively;
forming a differential common mode point between the emitters of the first and second transistors, thereby providing a first tank circuit through the first resonant element, first feedback path, and differential common mode point, and providing a second tank circuit through the second resonant element, second feedback path, and differential common mode point; and
generating a differential signal across the emitters of the first and second transistors.

35. A method of generating a differential signal in an integrated
oscillator having first and second transistors, each transistor having a base, collector, and emitter, comprising the steps of:
coupling the bases of the first and second transistors together;
AC coupling the coupled bases to ground;
supplying a DC bias to the coupled bases;
providing first and second resonant elements to the collectors of the first and second transistors;
supplying the DC bias to the first and second resonant elements;
providing first and second feedback paths across the collector and emitter of each of the first and second transistors by inductively coupling the collector and emitter of each of the first and second transistors respectively;
forming a differential common mode point between the emitters of the first and second transistors; and
generating a differential signal across the emitters of the first and second transistors.

36. A method of generating a differential signal in an oscillator formed of discrete components having first and second transistors, each transistor having a base, collector, and emitter, comprising the steps of:
coupling the bases of the first and second transistors together;
AC coupling the coupled bases to ground;
supplying a DC bias to the coupled bases;
providing first and second resonant elements to the collectors of the first and second transistors;
supplying the DC bias to the first and second resonant elements;
providing first and second feedback paths across the collector and emitter of each of the first and second transistors by inductively coupling the collector and emitter of each of the first and second transistors respectively;
forming a differential common mode point between the emitters of the first and second transistors; and
generating a differential signal across the emitters of the first and second transistors.

* * * * *